(12) United States Patent
Hsu

(10) Patent No.: US 6,388,895 B1
(45) Date of Patent: May 14, 2002

(54) TELECOMMUNICATION MAIN DISTRIBUTION FRAME STRUCTURE

(75) Inventor: Pey-Son Hsu, Changhua Hsien (TW)

(73) Assignee: Ching Feng Blinds Ind. Co., Ltd. (TW)

( * ) Notice: Subject to any disclaimer, the term of this patent is extended or adjusted under 35 U.S.C. 154(b) by 0 days.

(21) Appl. No.: 09/842,145

(22) Filed: Apr. 26, 2001

(51) Int. Cl.⁷ ................................................. H02B 1/01
(52) U.S. Cl. ...................... 361/829; 361/772; 361/788; 439/61
(58) Field of Search ................................. 361/760–762, 361/772–775, 776, 785, 788, 792, 803, 828–829; 439/61, 65

(56) References Cited

U.S. PATENT DOCUMENTS

| | | | |
|---|---|---|---|
| 4,802,862 A | * 2/1989 | Seidler | 439/83 |
| 5,009,387 A | * 4/1991 | Scott et al. | 249/16 |
| 5,381,306 A | * 1/1995 | Schumacher et al. | 361/792 |
| 6,086,386 A | * 7/2000 | Fjelstad et al. | 439/70 |
| 6,137,064 A | * 10/2000 | Kiani et al. | 174/266 |

* cited by examiner

Primary Examiner—Jayprakash N. Gandhi
Assistant Examiner—Tuan Dinh
(74) Attorney, Agent, or Firm—Troxell Law Office PLLC

(57) ABSTRACT

Telecommunication main distribution frame structure including a PC board, several pairs of insertion pins, four insertion seats, four buses, four corresponding insertion seats connected with one end of the buses and four connectors connected with the other end of the buses. The PC board is formed with several insertion holes and soldering holes electrically connected with each other. The insertion seats are soldered at the soldering holes of the PC board. The corresponding insertion seats are inserted in the insertion seats. The PC board has a left board, a middle board and a right boards integrally connected with each other. Each of two openings of the insertion hole is provided with a circle of shallow conductive face divided-by a locating split into a left and a right halves. Each of two openings of the soldering hole is provided with a shallow conductive face. The insertion pin is a rectangular column made of insulating material. Each of two ends thereof is formed with a lip and a resilient well conductive plate is connected between the lips. The insertion pins are inserted into the insertion holes with the conductive plate aimed at the locating split of the insertion hole, whereby the conductive plate is resiliently pressed to contact with the conductive faces of the insertion hole so as to electrically connect the conductive faces.

1 Claim, 5 Drawing Sheets

TELECOMMUNICATION MAIN DISTRIBUTION FRAME STRUCTURE

BACKGROUND OF THE INVENTION

The present invention is related to a telecommunication main distribution frame structure in which one PC board is used for connection of multiple sets of telephones so as to minimize the volume of the structure. In addition, one half of the numerous insertion pins for connecting with the telephones are saved to facilitate the use of the main distribution frame.

FIG. 1 shows a conventional telecommunication main distribution frame structure employing PC board, including a first PC board 10, a second PC board 20, several pairs of insertion pins 30, four insertion seats 60, four buses 70, four corresponding insertion seats 80 connected with one end of the buses 70 and four connectors 90 connected with the other end of the buses 70. The central portion of the first PC board 10 is formed with multiple copper-plated insertion holes 11 arranged into a square matrix. The upper and lower sections of one side are formed with multiple pairs of copper-plated soldering holes 13 arranged into two rows to form soldering section 12 for the insertion seat. The copper-plated soldering holes 13 are electrically connected with the calculated copper-plated insertion holes 11. The central portion of the second PC board 20 is formed with multiple copper-plated insertion holes 21 arranged into a square matrix. The left and right sections of one side are formed with multiple pairs of copper-plated soldering holes 23 arranged into two rows to form soldering section 22 for the insertion seat. The copper-plated soldering holes 23 are electrically connected with the calculated copper-plated insertion holes 21. The insertion pin 30 is a cylindrical pin made of well conductive metal and having a certain length. The insertion pin 30 has such a diameter that the insertion pin can be snugly inserted into the copper-plated insertion holes 11 of the first PC board 10 and the copper-plated insertion holes 21 of the second PC board 20.

When assembled, as shown in FIG. 2, the four insertion seats 60 are first respectively soldered on the soldering sections 12, 22 of the first and second PC boards 10, 20. Then, the corresponding insertion seats 80 of the buses 70 are inserted into the insertion seats 60. The connectors 90 of the buses 70 inserted in the first PC board 10 are inserted in an exchange. The connectors 90 of the buses 70 inserted in the second PC board 20 are connected with a telephone. Then, one end of each pair of insertion pins 30 is inserted into the copper-plated insertion holes 11 of the first PC board 10, while the other end is inserted into the corresponding copper-plated insertion holes 21 of the second PC board 20 (with reference to FIG. 3). The selection of the copper-plated insertion holes 11, 21 is calculated to achieve effective copper-plated insertion holes 11, 21 for a number of telephones to use. In the case that the telephones are one time increased, another group is added.

The above structure has some shortcomings as follows:
1. The conventional telecommunication main distribution frame structure includes a first PC board 10 and a second PC board 20 for exchange use. The first and second-PC boards 10, 20 are spaced from each other by a certain distance so that the main distribution frame has a considerably large volume and will occupy much room.
2. Each telephone necessitates two insertion pins 30 which are inserted in the first and second PC boards 10, 20. An exchange often has numerous lines so that a great number of insertion pins 30 will be necessary. Accordingly, the use of the main distribution frame is complicated and troublesome.

SUMMARY OF THE INVENTION

It is therefore a primary object of the present invention to provide a telecommunication main distribution frame structure in which one PC board is used for connection of multiple sets of telephones. In the case of more sets of telephones, only another main distribution frame is added. Therefore, the components are reduced and the volume of the structure is minimized without occupying much room.

It is a further object of the present invention to provide the above telecommunication main distribution frame structure in which one insertion pin serves to connect with one telephone so as to save one insertion pin. In the case that the exchange includes numerous lines, a half of numerous insertion pins can be saved and the use of the main distribution frame can be facilitated The present invention can be best understood through the following description and accompanying drawings wherein:

DETAILED DESCRIPTION OF THE PREFERRED EMBODIMENT

Figure 1:
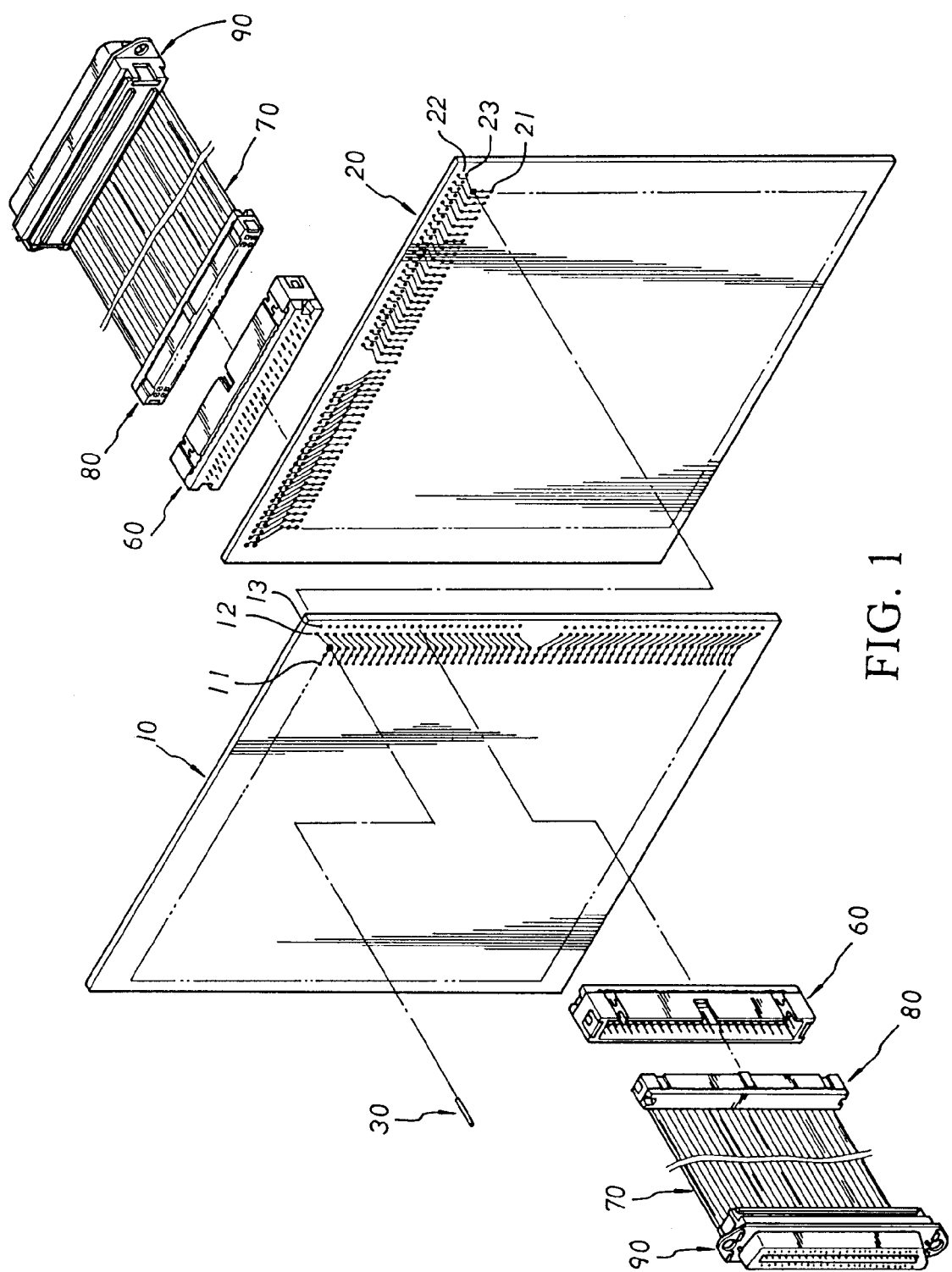
FIG. 1 is a perspective exploded view of a conventional telecommunication main distribution frame.
Figure 3:
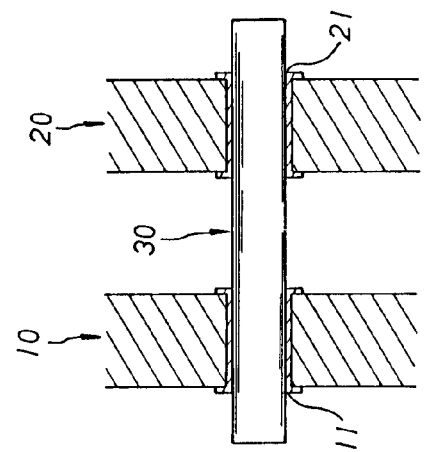
FIG. 3 is a sectional assembled view of a part of the conventional telecommunication main distribution frame.
Figure 2:
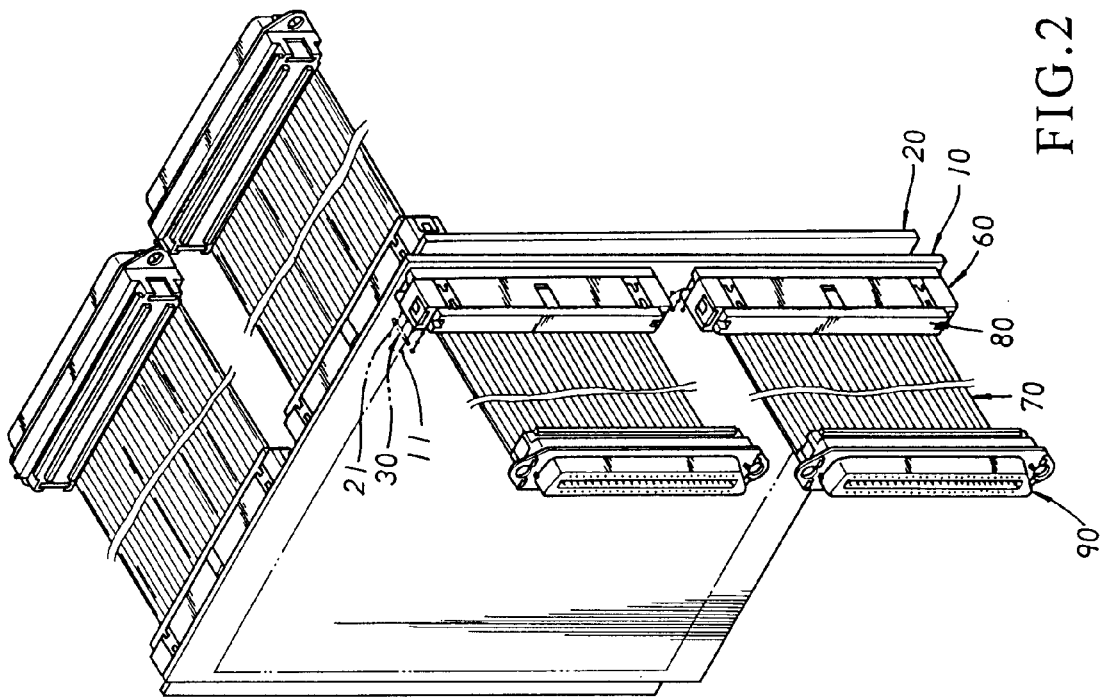
FIG. 2 is a perspective assembled view of the conventional telecommunication main distribution frame.
Figure 4:
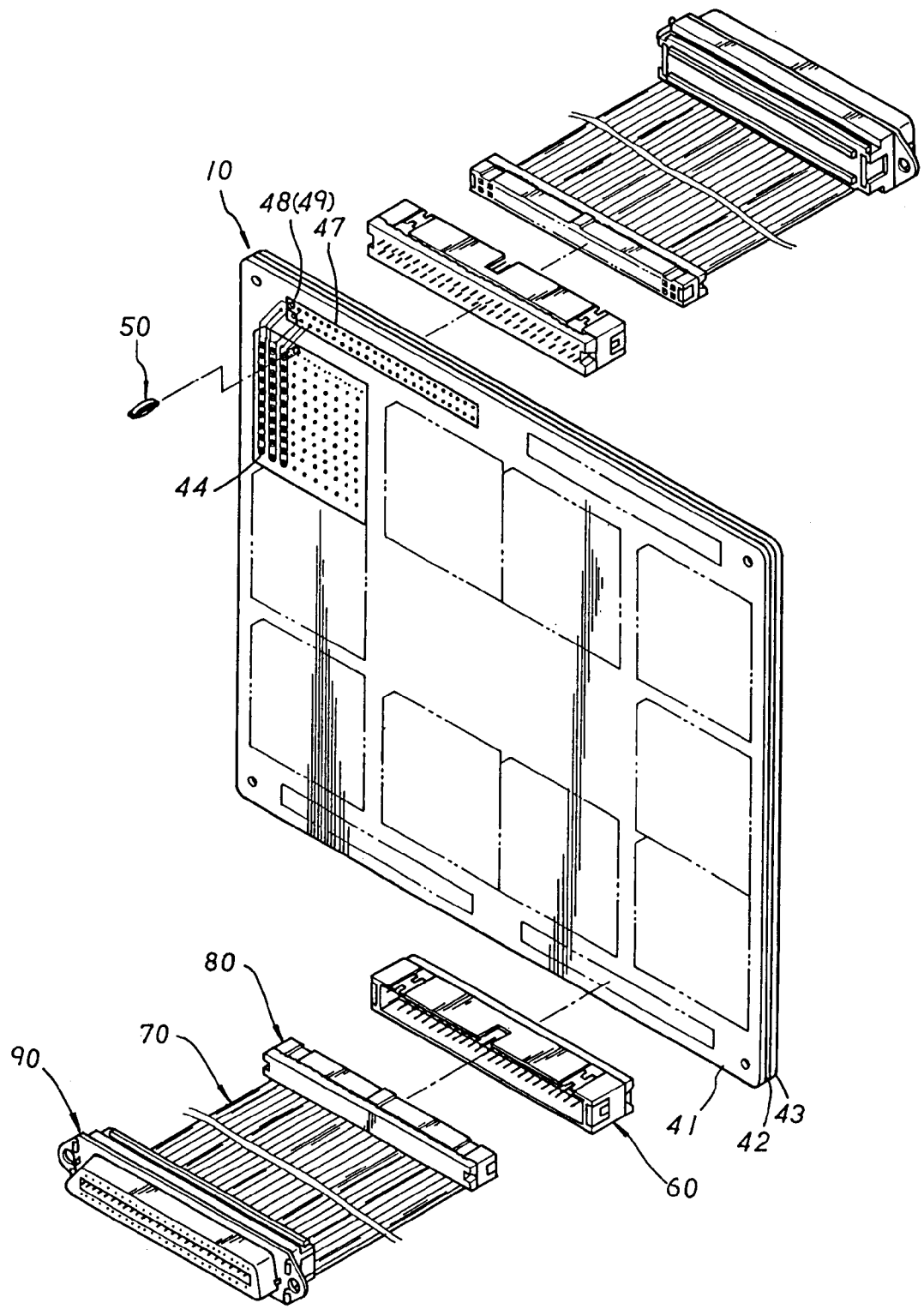
FIG. 4 is a perspective exploded view of the telecommunication main distribution frame structure of the present invention.
Figure 6:
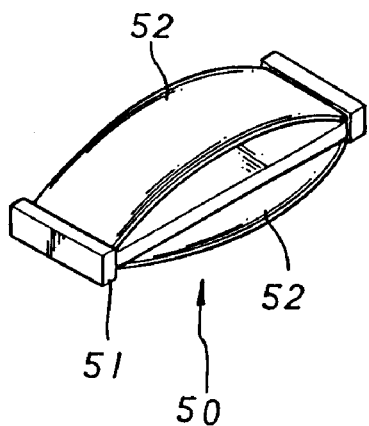
FIG. 6 is a perspective enlarged view of the insertion pin of the present invention.
Figure 5:
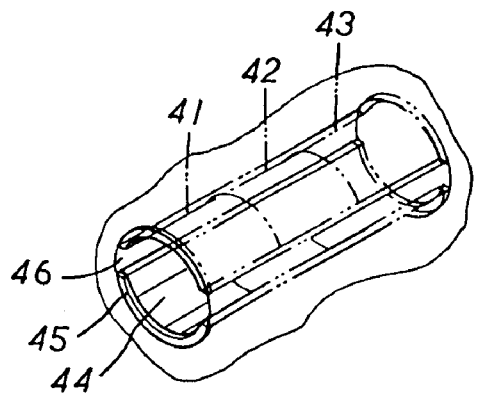
FIG. 5 is an enlarged view of the PC board of the present invention.

Please refer to FIG. 4. The present invention includes a PC board 40, several pairs of insertion pins 50, four insertion seats 60, four buses 70, four corresponding insertion seats 80 connected with one end of the buses 70 and four connectors 90 connected with the other end of the buses 70. The PC board 40 is three-layered, including a left board 41, a middle board 42 and a right board 43 integrally connected with each other. The central portion of the PC board 40 is formed with multiple groups of insertion holes 44 arranged into a matrix. Referring to FIG. 5, each of two openings of the insertion hole 44 (on the surfaces of the left and right boards) is provided with a circle of shallow conductive face 45. The conductive faces 45 are isolated from each other. The insertion hole 44 is longitudinally cut with a locating split 46 to divide the conductive face 45 into a left and a right halves. The left and right sections of upper and lower sides of the PC board 40 are respectively formed with multiple soldering holes 48 arranged into two rows to form soldering section 47 for the insertion seat. Each of two openings of the soldering hole 48 (on the surfaces of the left and right boards) is provided with a shallow conductive face 49. The conductive faces 49 of the soldering holes 48 on the surfaces of the left and right boards 41, 43 are respectively via wires electrically connected with the left and right halves of the conductive faces 45 of the calculated insertion holes 44. Referring to FIG. 6, the insertion pin 50 is a rectangular column made of insulating material. Each of two ends thereof is formed with a lip 51. A resilient well conductive plate 52 is connected between the lips 51 along the long side.

Figure 9:
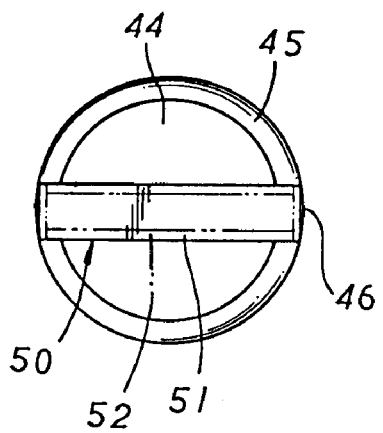
FIG. 9 is a cross-sectional enlarged view of a part of the present invention.
Figure 8:
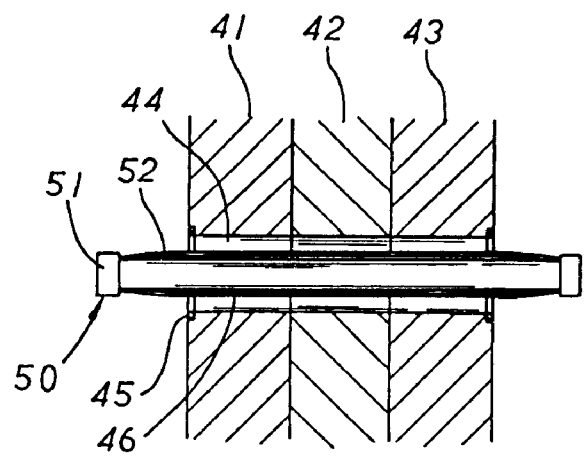
FIG. 8 is a longitudinal sectional enlarged view of a part of the present invention.
Figure 7:
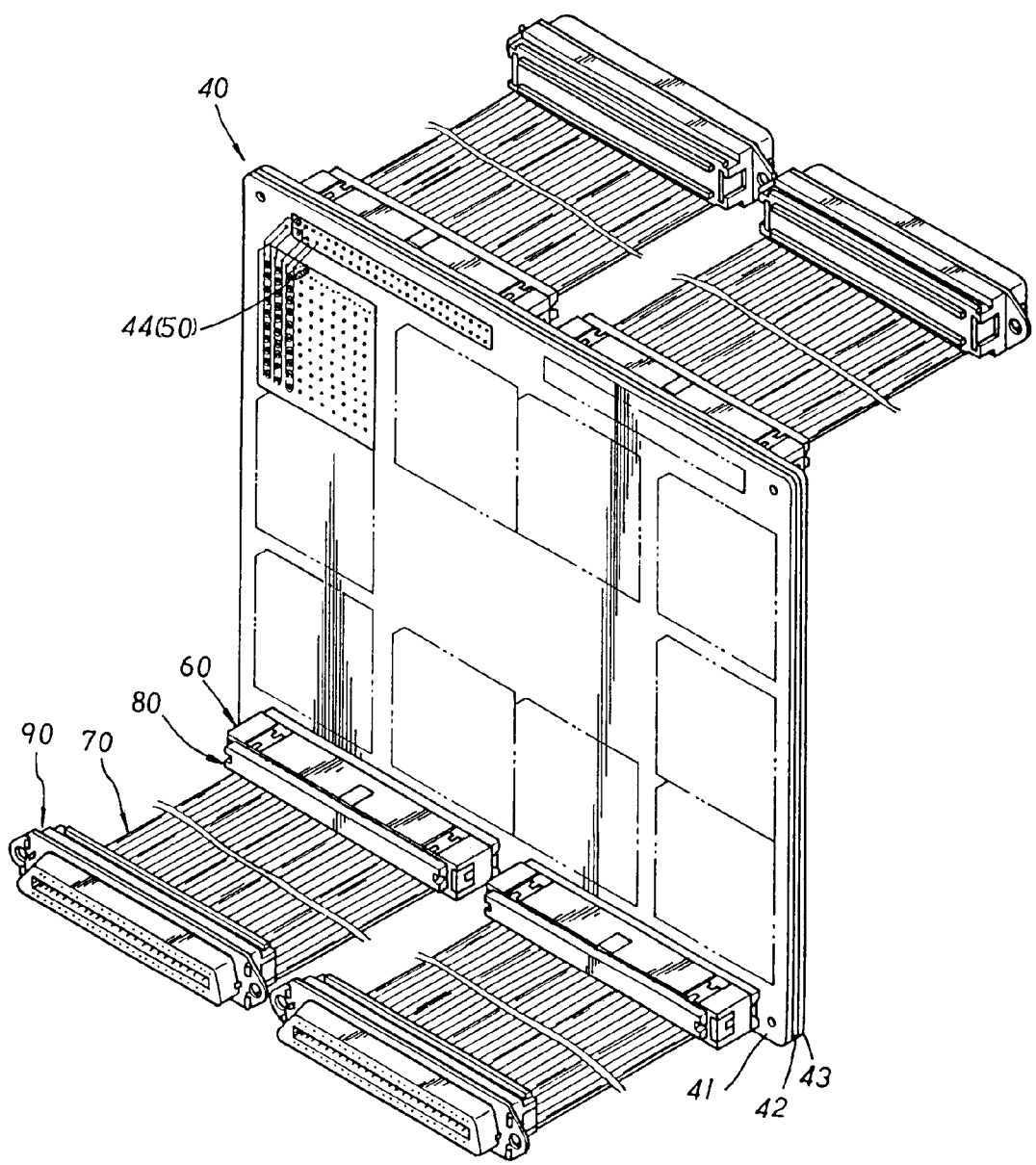
FIG. 7 is a perspective assembled view of the telecommunication main distribution frame structure of the present invention.

When assembled, as shown in FIG. 7, two insertion seats 60 are first soldered in the soldering holes 48 of the soldering sections 47 of upper side of the left board 41 of the PC board 40 with contact pins contacting with the conductive faces. 49. The other two insertion seats 60 are soldered in the soldering holes 48 of the soldering sections 47 of lower side of the right board 43 of the PC board 40 with contact pins contacting with the conductive faces 49. Then, the corresponding insertion seats 80 of the buses 70 are respectively inserted into the four insertion seats 60. The connectors 90 of the buses 70 inserted on the left board 41 are inserted in an exchange. The connectors 90 of the buses 70 inserted on the right board 43 are connected with the respective telephones. The insertion pins 50 are inserted into the effective insertion holes 44 obtained after calculated. When inserted, the face with the conductive plate 52 is aimed at the locating split 46 of the insertion hole 44, whereby the insertion pin 50 is prevented from rotating (with reference to FIG. 8). At this time, the conductive plate 52 is resiliently pressed to contact with the right conductive face 45 of the left board 41 and the right conductive face 45 of the right board 43 so as to electrically connect the conductive faces 45 as well as contact with the left conductive face 45 of the left board 41 and the left conductive face 45 of the right board 43 so as to electrically connect the conductive faces 45 (with reference to FIG. 9).

The present invention has the following advantages:

1. One PC board 40 is used for connection of multiple sets of telephones. In the case of more sets of telephones, only another main distribution frame is added. Therefore, the components are reduced and the volume of the structure is minimized without occupying much room.
2. The conductive face 45 of each opening of the insertion bole 44 is longitudinally cut with a locating split 46 to divide the conductive face 45 into a left and a right halves.

Cooperatively, each of two ends of the insertion pin 50 is formed with a lip 51 and a resilient well conductive plate 52 is connected between the lips 51 along the long side. One insertion pin 50 serves to connect with one telephone so as to save one insertion pin. In the case that the exchange includes numerous lines, a half of numerous insertion pins can be saved and the use of the main distribution frame can be facilitated.

The above embodiment is only used to illustrate the present invention, not intended to limit the scope thereof. Many modifications of the above embodiment can be made without departing from the spirit of the present invention.

What is claimed is:

1. Telecommunication main distribution frame structure comprising a PC board, several pairs of insertion pins, four insertion seats, four buses, four corresponding insertion seats connected with one end of the buses and four connectors connected with the other end of the buses, the PC board, being formed with several insertion holes and soldering holes forming soldering sections for the insertion seats, the insertion holes being electrically connected with the soldering holes, the insertion seats being soldered at the soldering holes of the soldering sections of the PC board, said main distribution frame structure being characterized in that:

the PC board is three-layered, having a left board, a middle board and a right boards integrally connected with each other, each of two openings of the insertion hole being provided with a circle of shallow conductive face, the insertion hole being longitudinally cut with a locating split to divide the conductive face into a left and a right halves, each of two openings of the soldering hole being provided with a shallow conductive face;

the insertion pin is a rectangular column made of insulating material, each of two ends thereof being formed with a lip, a resilient well conductive plate being connected between the lip along the long side of the insertion pin; and the insertion pins are inserted into the insertion holes that the face with the conductive plate is aimed at the locating split of the insertion hole, whereby the conductive plate is resiliently pressed to electrical contact with a left side and a right side of the conductive face of the insertion hole.

\* \* \* \* \*